US009013621B2

(12) United States Patent
Chen

(10) Patent No.: US 9,013,621 B2
(45) Date of Patent: Apr. 21, 2015

(54) IMAGE SENSOR MODULE AND CAMERA MODULE USING SAME

(71) Applicant: Hon Hai Precision Industry Co., Ltd., New Taipei (TW)

(72) Inventor: Shin-Wen Chen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 90 days.

(21) Appl. No.: 13/727,459

(22) Filed: Dec. 26, 2012

(65) Prior Publication Data

US 2014/0049686 A1  Feb. 20, 2014

(30) Foreign Application Priority Data

Aug. 16, 2012  (TW) ................................. 101129660

(51) Int. Cl.
*H04N 5/225* (2006.01)
*H04N 5/335* (2011.01)
*H01L 27/146* (2006.01)

(52) U.S. Cl.
CPC ........ *H01L 27/14618* (2013.01); *H04N 5/2253* (2013.01); *H01L 27/14625* (2013.01); *H04N 5/2257* (2013.01)

(58) Field of Classification Search
CPC .... H04N 5/335; H04N 5/2254; H04N 5/2253
USPC .......................................... 348/340, 373, 374
See application file for complete search history.

(56) References Cited

U.S. PATENT DOCUMENTS 8,780,243 B2 * 7/2014 Chen .............................. 348/294
2011/0194023 A1 * 8/2011 Tam et al. ..................... 348/374

* cited by examiner

*Primary Examiner* — Twyler Haskins
*Assistant Examiner* — Quang Le
(74) *Attorney, Agent, or Firm* — Novak Druce Connolly Bove + Quigg LLP

(57) ABSTRACT

An image sensor module includes a rigid-flex board, an image sensor, and a supporting plate. The rigid-flex board defines a through hole, and includes a plurality of connecting pads adjacent to the through hole. The image sensor is positioned on one side of the rigid-flex board, and includes an image surface and a plurality of pins adjacent to the image surface. The image surface faces the through hole, and the pins are connected to the connecting pads. The supporting plate is positioned on the side of the rigid-flex board. The image sensor is positioned between the supporting plate and the rigid-flex board.

8 Claims, 5 Drawing Sheets

IMAGE SENSOR MODULE AND CAMERA MODULE USING SAME

BACKGROUND

1. Technical Field

The present disclosure relates to optical modules, and particularly, to an image sensor module and a camera module including the image sensor module.

2. Description of Related Art

Image sensor modules generally include an image sensor and a ceramic substrate supporting the image sensor. As the ceramic substrate has a better flatness, therefore, an optical axis of an image surface of the image sensor can be easily adjusted to align with an optical axis of a lens module which is also positioned on the ceramic substrate. However, the cost of the ceramic substrate is high and the ceramic substrate needs to be adhered on a flexible printed circuit board (FPCB) by an anisotropic conductive adhesive film (ACF) before being assembled into an electrical device. As such, the cost of the image sensor module is increased.

Therefore, it is desirable to provide an image sensor module and a camera module, which can overcome the limitations described.

DETAILED DESCRIPTION

Embodiments of the disclosure will be described with reference to the drawings.

Figure 1:
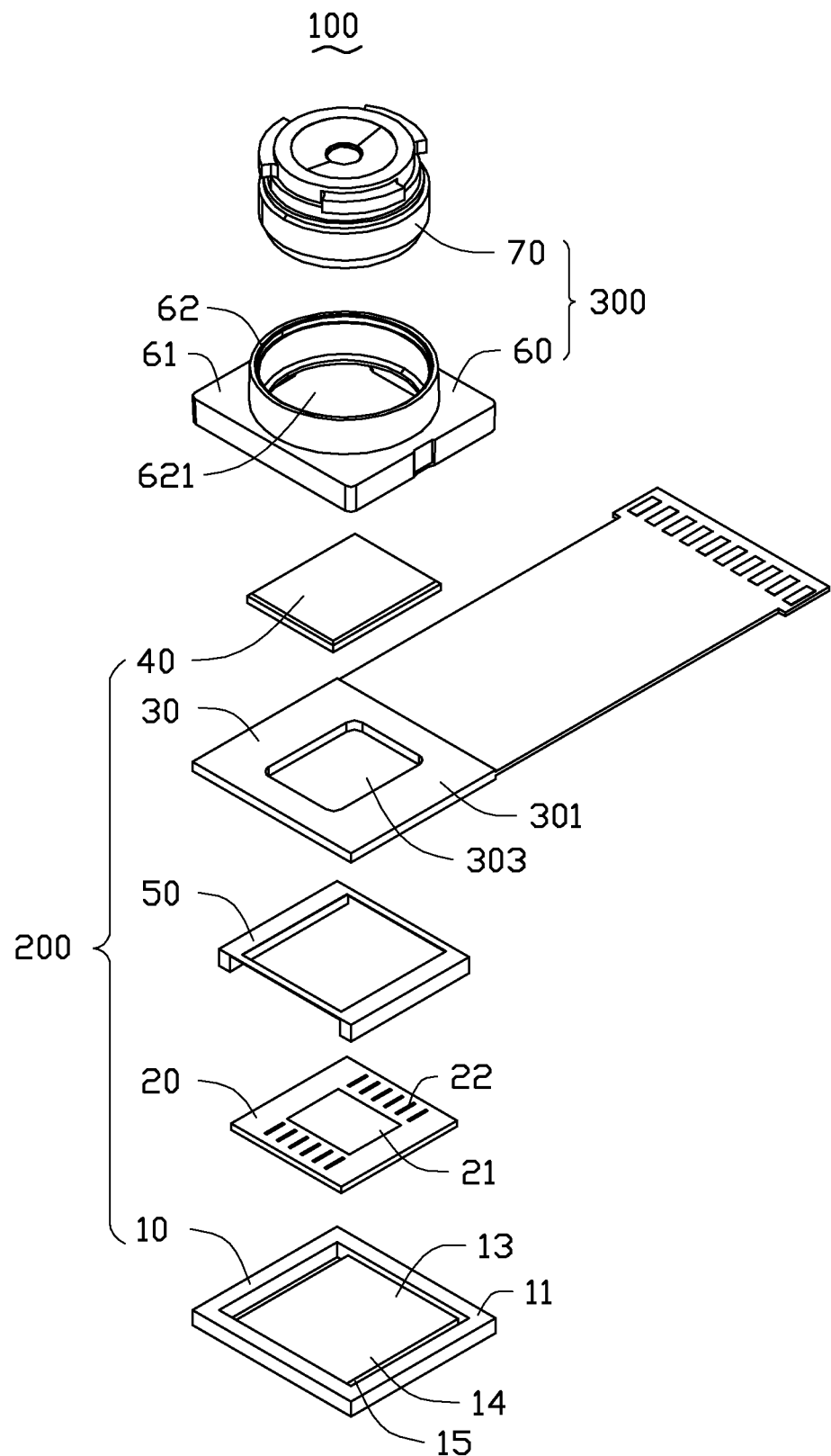
FIG. 1 is an isometric, exploded, and schematic view of a camera module in accordance with an exemplary embodiment.
Figure 2:
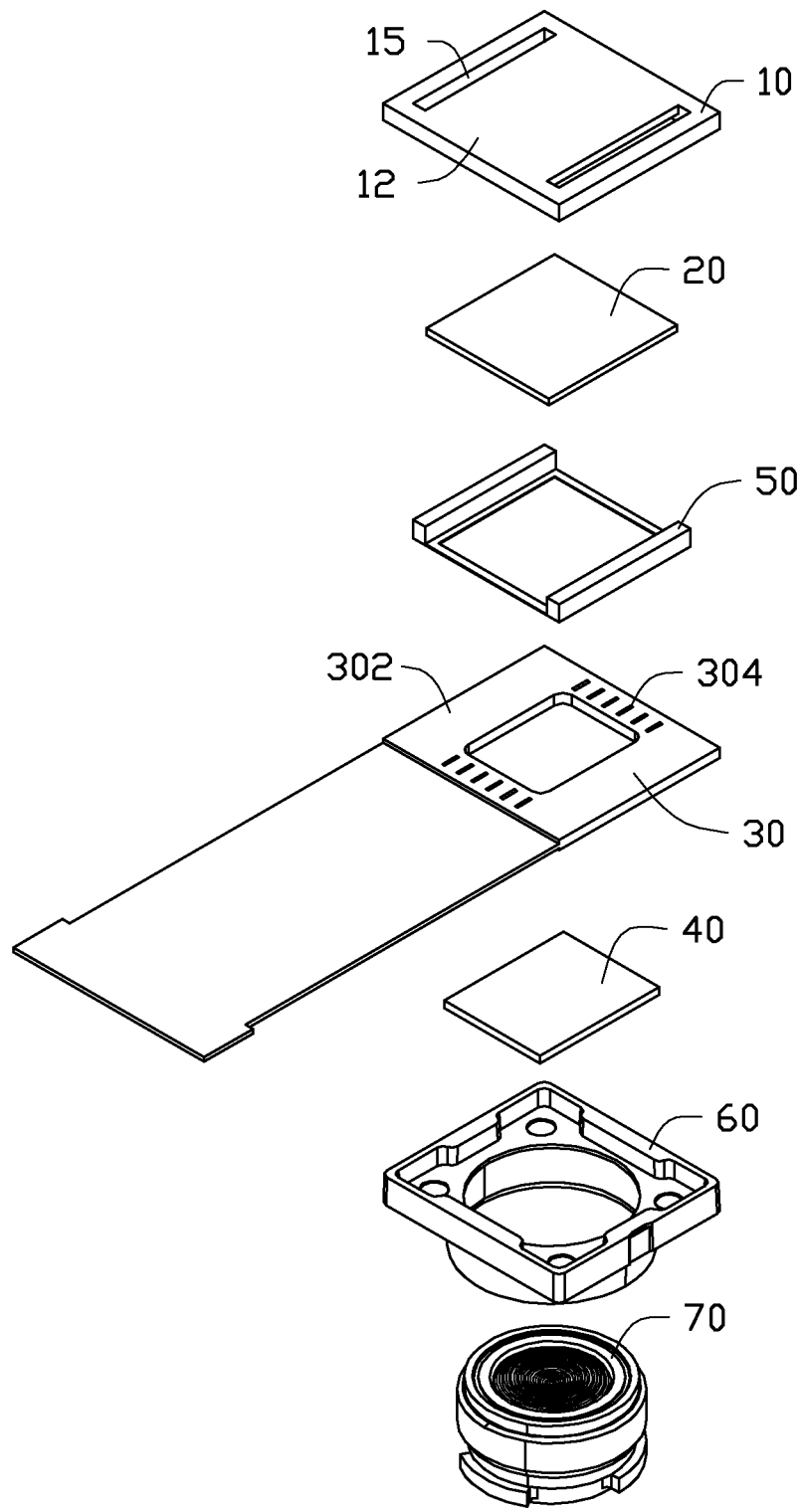
FIG. 2 is similar to FIG. 1, but viewed from another angle.

FIGS. 1-2 show a camera module 100 according to an exemplary embodiment. The camera module 100 includes an image sensor module 200 and a lens module 300 positioned on the image sensor module 200. The image sensor module 200 includes a supporting plate 10, an image sensor 20, a rigid-flex board 30, a filter 40, and glue 50. The lens module 300 includes a lens holder 60 and a lens unit 70.

The supporting plate 10 is rectangular, and is formed by, for example, injection molding technologies with a plastic material. The supporting plate 10 includes a top surface 11 and a bottom surface 12 opposite to the top surface 11. The supporting plate 10 defines a receiving recess 13 on the top surface 11, generally adjacent to a center of the top surface 11. The receiving recess 13 includes a supporting surface 14 parallel with the bottom surface 12. The supporting plate 10 defines two elongated position recesses 15 penetrating the supporting surface 14 and the bottom surface 12. The two position recesses 15 are parallel with each other, and adjacent to two opposite sides of the supporting surface 14.

The image sensor 20 includes an image surface 21 and a number of pins 22 adjacent to two opposite edges of the image surface 21. The image sensor 20 is configured for converting light rays projected on the image surface 21 to image signals in form of electric signals, and the image signals are output from the pins 22. In the embodiment, the image sensor 20 can be a complementary metal-oxide-semiconductor transistor (CMOS) sensor or a charge coupled device (CCD) sensor.

Figure 3:
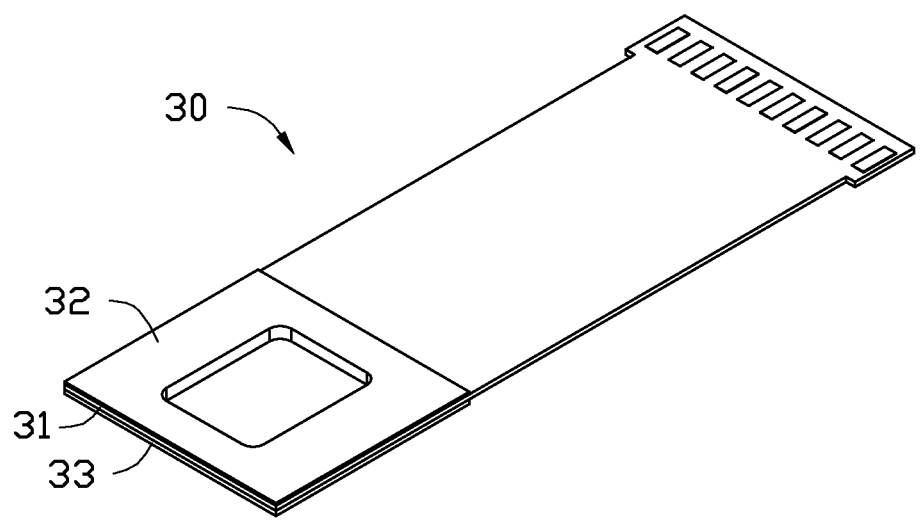
FIG. 3 is an isometric view of a rigid-flex board of the camera module of FIG. 1.

FIG. 3 shows the rigid-flex board 30 of FIG. 1. The rigid-flex board 30 includes a flexible printed circuit board (FPCB) 31, at least one adhering layer 32, and at least one semi-solidified glue layer 33. Both of the area of the adhering layer 32 and the area of the semi-solidified glue layer 33 are less than the area of the FPCB 31. The FPCB 31 is sandwiched the adhering layer 32 and the semi-solidified glue layer 33. The adhering layer 32 and the semi-solidified glue layer 33 are adjacent to one end of the FPCB 31. The adhering layer 32 includes an upper surface 301 facing away from the FPCB 31. The semi-solidified glue layer 33 includes a lower surface 302 facing away from the FPCB 31. The rigid-flex board 30 defines a through hole 303 penetrating the upper surface 301 and the lower surface 302. The rigid-flex board 30 includes a number of connecting pads 304. The connecting pads 304 are positioned on the lower surface 302, and generally adjacent to two opposite edges of the through hole 303. The connecting pads 304 are electrically connected to the FPCB 31. A number of electrical elements (not shown), such as resistor and capacitor, are electrically connected on the upper surface 301 surrounding the through hole 303.

The filter 40 is rectangular, and is made of transparent materials, such as glass. The filter 40 is configured for filtering infrared light out from the light projected thereon.

Figure 4:
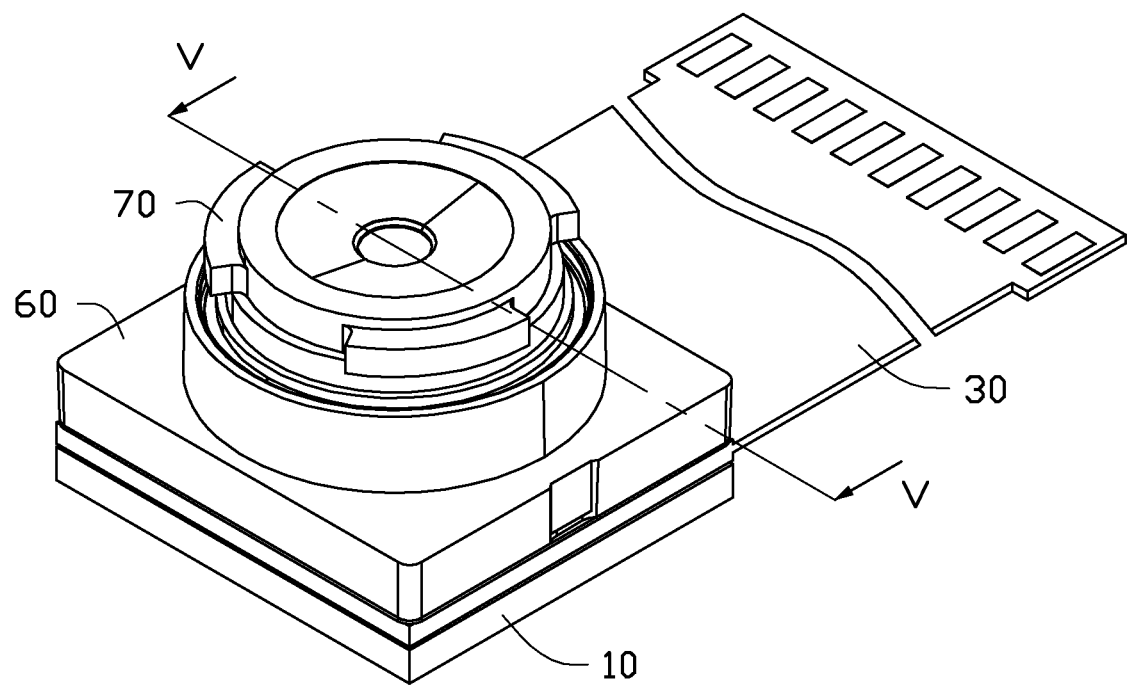
FIG. 4 is an assembled view of the camera module of FIG. 1.
Figure 5:
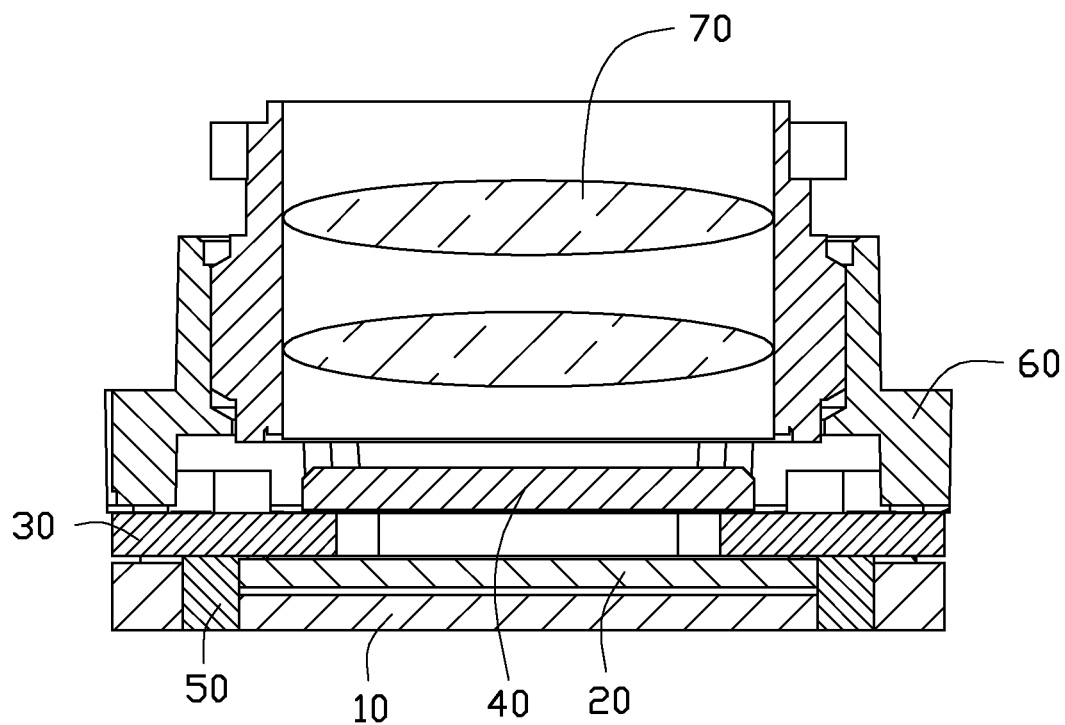
FIG. 5 is a cross-sectional view taken along a line V-V of FIG. 4.

FIGS. 4-5 show an assembling process of the image sensor module 200. The image sensor 20 is positioned on the lower surface 302 of the rigid-flex board 30 by a method of flip-chip package. The pins 22 are electrically connected to the connecting pads 304. The image surface 21 faces the through hole 303. The supporting plate 10 is positioned on the lower surface 302 of the rigid-flex board 30, and the image sensor 20 is received in the receiving recess 13. The glue 50 is applied to the receiving recess 13 through the two position recesses 15 by an injection device (not shown). The glue 50 surrounds the image sensor 20. After the position recesses 15 are filled with the glue 50, the glue 50 is solidified by curing. At last, the filter 40 is packaged on the upper surface 301 of the rigid-flex board 30, and the through hole 303 is sealed by the filter 40.

The lens holder 60 includes a seat 61 and a receiving portion 62 positioned on one end of the seat 61. The seat 61 is a hollow frame/cover. The receiving portion 62 defines a lens hole 621 communicating with the seat 61. The lens unit 70 is received in the lens hole 621, and includes at least one lens (not shown) and a barrel receiving the at least one lens.

In the process of assembling the camera module 100, the lens holder 60 receiving the lens unit 70 is positioned on the upper surface 301 of the rigid-flex board 30. The seat 61 surrounds the through hole 303. The filter 40 is received in the seat 61. The optical axis of the lens unit 70 is collinear with the optical axis of the image sensor 20.

In use, the image sensor 20 converts the light rays penetrating the lens module 300 to the image signals. The image signals are output to the FPCB 31 of the rigid-flex board 30 through the pins 22 and the connecting pads 304. As the cost of the rigid-flex board 30 is low and can be directly assembled into an electrical device, the cost of the camera module 100 is decreased.

Particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. An image sensor module, comprising:
a rigid-flex board defining a through hole, the rigid-flex board comprising a flexible printed circuit board (FPCB), at least one adhering layer, and at least one semi-solidified glue layer; the FPCB being sandwiched between the at least one adhering layer and the at least one semi-solidified glue layer, and the rigid-flex board further comprising a plurality of connecting pads adjacent to the through hole, the area of each adhering layer and the area of each semi-solidified glue layer being less than the area of the FPCB, the at least one adhering layer and the at least one semi-solidified glue layer being adjacent to one end of the FPCB;
an image sensor positioned on one side of the rigid-flex board, and comprising an image surface and a plurality of pins adjacent to the image surface, the image surface facing the through hole, and the pins electrically connected to the connecting pads; and
a supporting plate positioned on the side of the rigid-flex board, the image sensor positioned between the supporting plate and the rigid-flex board.

2. The image sensor module of claim 1, wherein the supporting plate defines a receiving recess, and the receiving recess receives the image sensor.

3. The image sensor module of claim 1, wherein the connecting pads are electrically connected to the FPCB.

4. The image sensor module of claim 1, wherein the through hole penetrates the FPCB, the at least one adhering layer, and the at least one semi-solidified glue layer.

5. A camera module, comprising:
an image sensor module, comprising:
a rigid-flex board defining a through hole, the rigid-flex board comprising a flexible printed circuit board (FPCB), at least one adhering layer, and at least one semi-solidified glue layer; the FPCB being sandwiched between the at least one adhering layer and the at least one semi-solidified glue layer, and the rigid-flex board further comprising a plurality of connecting pads adjacent to the through hole, the area of each adhering layer and the area of each semi-solidified glue layer each being less than the area of the FPCB, the at least one adhering layer and the at least one semi-solidified glue layer being adjacent to one end of the FPCB;
an image sensor positioned on one side of the rigid-flex board, and comprising an image surface and a plurality of pins adjacent to the image surface, the image surface facing the through hole, and the pins electrically connected to the connecting pads; and
a supporting plate positioned on the side of the rigid-flex board, the image sensor positioned between the supporting plate and the rigid-flex board; and a lens module, comprising:
a lens holder positioned on the other side of the rigid-flex board opposite to the image sensor; and
a lens unit received in the lens holder.

6. The camera module of claim 5, wherein the supporting plate defines a receiving recess, and the receiving recess receives the image sensor.

7. The camera module of claim 5, wherein the connecting pads are electrically connected to the FPCB.

8. The camera module of claim 5, wherein the through hole penetrates the FPCB, the at least one adhering layer, and the at least one semi-solidified glue layer.

* * * * *